(12) United States Patent
Cohen

(10) Patent No.: US 10,027,354 B2
(45) Date of Patent: Jul. 17, 2018

(54) PHASED ARRAY WEIGHTING FOR POWER EFFICIENCY IMPROVEMENT WITH HIGH PEAK-TO-AVERAGE POWER RATIO SIGNALS

(71) Applicant: Intel IP Corporation, Santa Clara, CA (US)

(72) Inventor: Emanuel Cohen, Zichron Yaacov (IL)

(73) Assignee: Intel IP Corporation, Santa Clara, CA (US)

( * ) Notice: Subject to any disclaimer, the term of this patent is extended or adjusted under 35 U.S.C. 154(b) by 504 days.

(21) Appl. No.: 14/668,274

(22) Filed: Mar. 25, 2015

(65) Prior Publication Data
US 2016/0285481 A1    Sep. 29, 2016

(51) Int. Cl.
| H04B 7/00 | (2006.01) |
| H04B 1/04 | (2006.01) |
| H04B 7/0456 | (2017.01) |
| H01Q 3/34 | (2006.01) |
| H01Q 3/38 | (2006.01) |
| H01Q 21/29 | (2006.01) |
| H03F 1/02 | (2006.01) |

(Continued)

(52) U.S. Cl.
CPC ............... *H04B 1/04* (2013.01); *H01Q 3/34* (2013.01); *H01Q 3/38* (2013.01); *H01Q 21/293* (2013.01); *H03F 1/02* (2013.01); *H03F 3/24* (2013.01); *H04B 7/0465* (2013.01); *H01Q 21/28* (2013.01); *H04B 1/0483* (2013.01); *H04B 2001/045* (2013.01); *H04B 2001/0408* (2013.01); *Y02D 70/00* (2018.01); *Y02D 70/1222* (2018.01); *Y02D 70/1242* (2018.01); *Y02D 70/1262* (2018.01); *Y02D 70/142* (2018.01); *Y02D 70/144* (2018.01); *Y02D 70/146* (2018.01); *Y02D 70/22* (2018.01); *Y02D 70/40* (2018.01); *Y02D 70/444* (2018.01)

(58) Field of Classification Search
CPC .......... H04B 1/04; H04B 7/0465; H01Q 3/34; H01Q 3/38; H01Q 3/26; H01Q 21/293
USPC ...................................................... 342/367
See application file for complete search history.

(56) References Cited

U.S. PATENT DOCUMENTS

| 6,512,474 | B2 * | 1/2003 | Pergande ........... H04B 1/71635 |
| | | | 332/144 |
| 6,593,827 | B2 * | 7/2003 | Chethik ................ H04L 27/361 |
| | | | 332/103 |

(Continued)

OTHER PUBLICATIONS

European Search Report dated Jul. 14, 2016 EP 16 15 3901.
Liang, et al. "Transmitter Linearization by Beamforming." IEEE Journal of Solid State Circuits, vol. 46, No. 9, Sep. 2011.

*Primary Examiner* — Chuong P Nguyen
(74) *Attorney, Agent, or Firm* — Eschweiler & Potashnik, LLC

(57) ABSTRACT

A phased array includes a number of transmission units with an unequal array of power amplifiers for receiving or transmitting input signals at millimeter wave frequencies. The phase array transmits millimeter waves in air to reconstruct original phase-and amplitude signals by combining the signals from the unequal array of power amplifiers. The unequal array of power amplifiers comprises power amplifiers having a higher peak power than other power amplifiers of the array. The power amplifiers can also have different transmission powers from one another.

21 Claims, 11 Drawing Sheets

(51) Int. Cl.
*H03F 3/24* (2006.01)
*H01Q 21/28* (2006.01)

(56) References Cited

U.S. PATENT DOCUMENTS

| | | | | |
|---|---|---|---|---|
| 6,646,505 B2* | 11/2003 | Anderson | ............ | H03F 1/3252 330/124 R |
| 8,204,148 B2* | 6/2012 | Goodman | ................ | H03F 3/24 341/173 |
| 8,774,196 B2* | 7/2014 | Schmidt | .............. | H04B 7/0682 342/383 |
| 8,836,578 B2* | 9/2014 | Kenington | ............ | H01Q 1/246 342/372 |
| 8,963,608 B1* | 2/2015 | Sun | .................... | H04L 27/2623 327/309 |
| 2004/0124916 A1 | 7/2004 | Kontson | | |
| 2005/0181751 A1* | 8/2005 | Fenk | ........................ | H01Q 1/36 455/127.1 |
| 2006/0067426 A1* | 3/2006 | Maltsev | .................. | H04L 25/49 375/297 |
| 2009/0040107 A1 | 2/2009 | Yun et al. | | |
| 2010/0079341 A1* | 4/2010 | Kenington | ............ | H01Q 1/246 342/368 |
| 2011/0170624 A1 | 7/2011 | Goodman et al. | | |
| 2012/0139787 A1* | 6/2012 | Li | ........................... | H01Q 3/26 342/368 |
| 2013/0156085 A1* | 6/2013 | Nicolson | ........... | H04L 25/03878 375/229 |
| 2013/0265195 A1 | 10/2013 | Kenington | | |
| 2014/0050283 A1* | 2/2014 | Leiba | .................... | H01Q 13/22 375/298 |
| 2016/0156489 A1* | 6/2016 | Kim | ...................... | H04L 7/0331 375/305 |
| 2016/0191003 A1* | 6/2016 | Yamanouchi et al. | . | H04B 1/005 330/295 |
| 2017/0133990 A1* | 5/2017 | Jang | ........................ | H03F 3/193 |

\* cited by examiner

PHASED ARRAY WEIGHTING FOR POWER EFFICIENCY IMPROVEMENT WITH HIGH PEAK-TO-AVERAGE POWER RATIO SIGNALS

FIELD

The present disclosure relates to phased arrays, and more specifically, weighting of phased arrays for power efficiency improvement with high peak-to-average power ratio signals.

BACKGROUND

High-efficiency radio frequency (RF) systems are desired in portable battery-operated wireless communication. With modern wireless systems, modulation format has a high envelope peak-average ratio (PAR) and linear power amplifiers being implemented have low average efficiency. In the emerging millimeter wave (mmW) systems (e.g., WiGig and 5G), a power efficiency drops even more due to a higher back-off for linearity and an initial low efficiency of the power amplifier at mmW frequency bands. The spectrum between 30 GHz and 300 GHz, for example, can be referred to as the millimeter wave band because the wavelengths for these frequencies are about one to ten millimeters. Different techniques, such as with envelope tracking (ET) and polar digital transmitters to boost PA efficiency show some promise at low frequency and moderate data rates of tens of MHz, but become ineffective at mmW and with Gb/s rates.

DETAILED DESCRIPTION

Figure 1:
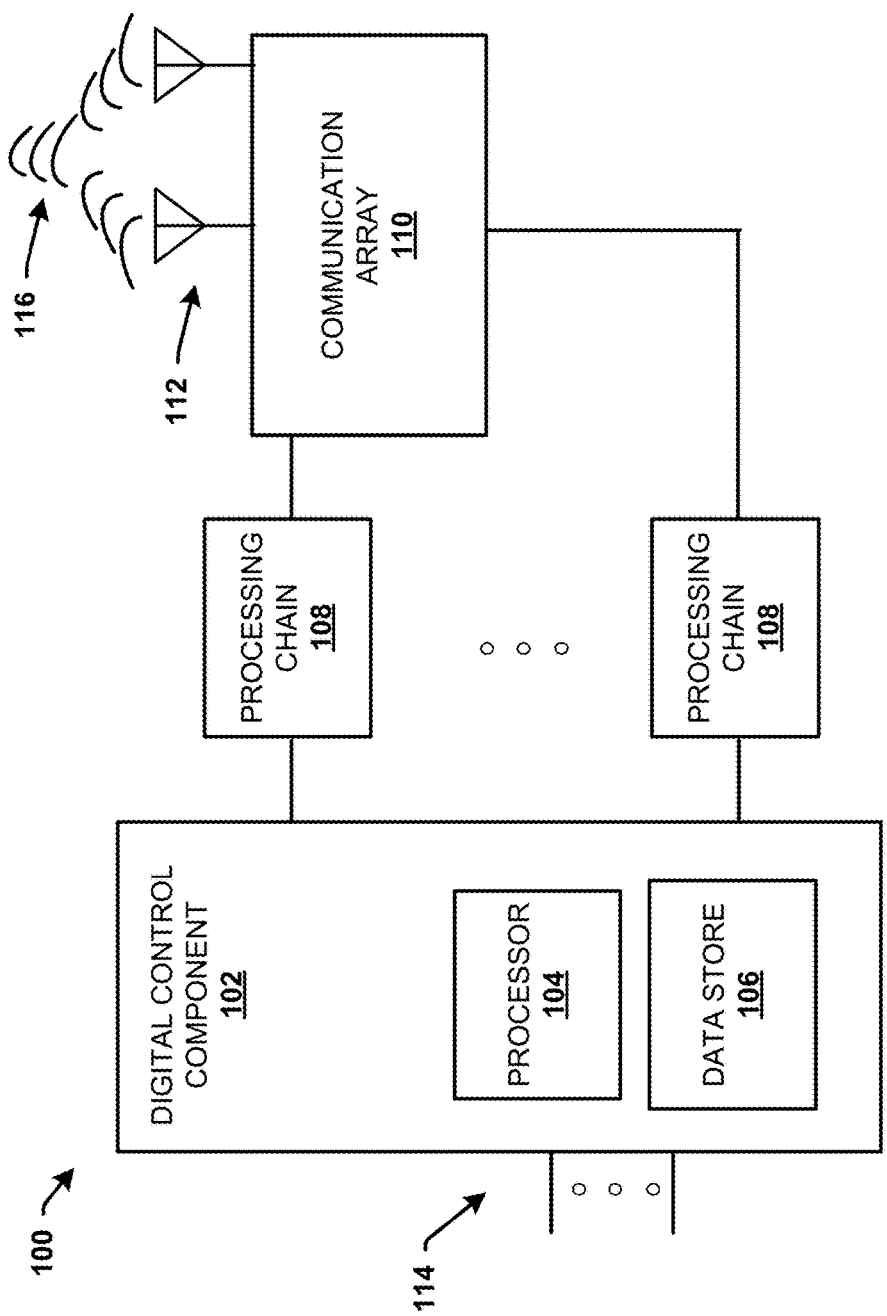
FIG. 1 is a block diagram illustrating a phased array system or device according to various aspects disclosed.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, a circuit or a circuit element, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components or elements without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies of power control for wireless communication systems, various aspects are described for increasing the transceiver power efficiency for millimeter wave systems (e.g., WiGig, 5G, or other millimeter wave systems) that combine different data streams over an air medium, or in space, instead of on or at the transmitter die, chip, board or device.

Beamforming is a signal processing technique that can be used in communication arrays for directional signal transmission or reception. Components of a phased array are combined in such a way that signals at particular angles experience constructive interference while others experience destructive interference. Beamforming can be used at both the transmitting and receiving ends in order to achieve spatial selectivity. Compared to omni-directional reception/transmission the amount of improvement in peak-to-average power ratio (PAPR) or signal strength is in the receive/transmit gain (or loss). Large bandwidths available at millimeter wave frequencies for communication systems can further be used to combat the exponential rise in the demand for data traffic. At millimeter wave frequencies, massive antenna arrays can be used to beamform communication signals in a particular direction in order to mitigate the effects of increased path loss. Beamforming can be applied either in the digital domain or analog radio frequency (RF) domain.

According to various aspects being disclosed, a phased array system or device increases power amplifier efficiency without having to add more antennas and signal processing chains (e.g., transmitter radio frequency (RF) chains, receiver RF chains, or the like). A phased array system comprises multiple signal processing chains in a phased array transmitter/receiver operating at millimeter wave (mmW) frequencies to boost efficiency with back-off levels from the peak/maximum/saturated/average power of the power amplifier, which is done without an increase in die size and antenna array size. In one advantage, a 50% efficiency boost or greater can be obtained at back-off points higher than 8 dB from a maximum power amplifier efficiency (Psat) that can be for 16QAM WiGig transmissions or 5G transmissions.

In one example, the phased array systems being disclosed include a phased array device having an array of communication (array) units, which can each comprising at least one power amplifier that generates a gain or a transmission power for at least one corresponding antenna. The array of communication units (or communication array) is formed by an unequal array of power amplifiers that have different output power levels and different peak power levels (e.g., a maximum/saturation/average power) for communicating data signals with a corresponding antenna or antenna port. The optimal combination of activated power amplifiers within the unequal power amplifier array can be determined as a function of, or based on, a trade-off between the peak power and the back-off power. The phased array system can be configured to transmit with over the air summation to create, or reconstruct, a communicated signal (e.g., an amplitude- and phase-modulated signal) with the unequal array of communication units. The communications over the air (or in a space medium) can be generated with unequal arrays at greater power efficiencies than with a uniform array of power amplifiers having equal, or approximately the same, output power levels and saturation power levels in comparison. The phased array system can generate signal peaks and transmit, or receive, the signal peaks through power amplifiers having different parameters from one another; thereby, making the array unequal, or not uniform. The communication array or the array of power amplifiers disclosed herein can be optimized for a transmission power and efficiency that improves total device power efficiency, while also maintaining a same number of signal processing chains as a uniform array in a phased array system utilizing over-the-air summation. Additional aspects and details of the disclosure are further described below with reference to figures.

Referring to FIG. 1, illustrated is an example of a wireless communication system or device in accordance with various aspects being described. The wireless communication device 100 can be a phased array device 100 that includes a digital control component 102, one or more processing chains 108 and a communication array 110. The phased array device 100 operates with an array of antennas 112, in which relative phases of the signals feeding the antennas are varied in phase and gain relationships to ensure that the effective radiation pattern of the array of antennas 112 is reinforced in a desired direction and suppressed in undesired directions.

The digital control component 102 can comprise a processor 104 and the data store 106. The digital control component 102 can operate to process input signals by one or more pre-coders, encoders, decoders, or other communication components for receiving or transmitting communication data. The digital control component 102, for example, can receive a diversity of data signals from different carriers at one or more data inputs 114, such as RF signal inputs in a broadband frequency range, for example. The digital control component 102 can process the input signals as millimeter wave signals for transmission in 16QAM WiGig, 5G or other wireless transmission in a system having mmW phased array beam-forming operations that operate with over the air transmissions.

The phased array device 100 can operate as a digital beam-forming device, an analog beam-forming device or a hybrid beam-forming device with both digital and analog beam-forming operations. The processing chains 108 of the phased array device 100 can operate as RF receiver or transmitter processing chains, such as with a transceiver path comprising baseband or RF communication components, including the communication array 110 and the antenna array 112.

In one example, losses from on-chip components are reduced by combining the signal outputs of the communication array 110 in space, over the air, or in an air medium, rather than on chip, at the transceiver chip or the transmitter circuit board of the processing chain 108. The communication array 110 thus includes an array of power amplifiers (e.g., power amplifiers 202a-202f of FIG. 2) that operate with corresponding antennae 112 or antenna ports configured to couple corresponding antennae 112 to facilitate output signal summation in air with a predefined angle to reconstruct or beam form signal to generate an original amplitude and a phase modulated signal from the processing chain 108 in space.

The communication array 110 comprises power amplifiers that are different from one another for delivering an output power and a gain to antenna ports or the antennas 112, for example. One group of communication array components (e.g., power amplifiers) can have a lower peak (maximum/saturated/average) power than another group of power amplifiers of the communication array 110; thus, forming an unequal array. For example, a first set of power amplifiers in the communication array 110 can have different peak powers than a second set of power amplifiers, such as a lower maximum saturation power than a second set of power amplifiers. In addition, the first set of power amplifiers can also have a different output/transmission power than the second set of power amplifiers, such as a lower output power than the second set of power amplifiers.

Further, the communication array 110 comprises an unequal array, in which the power amplifiers of the communication array 110 have different maximum saturation power levels for operation and different levels of output powers for transmission. The communication array 110 can have power amplifiers that vary from one another in their operational parameters (e.g., peak power, transmission output power, etc.), or have differing groups or sets of power amplifiers that vary from one another in these operational parameters. In one aspect, the number of power amplifiers having a lower maximum saturation power or a lower output power can be different from other power amplifiers of the communication array 110 based on a predetermined ratio, in which the number varies from among the number of power amplifiers with a higher maximum saturation power and the number with a higher output power.

In addition, the ratio of the number of the first set of power amplifiers to the number of second set of power amplifiers can dictate an efficiency level of the transmissions. The communication array 110, for example, can comprise a higher number of activated lower powered (a lower saturation power level and output power level) power amplifiers than activated higher powered power amplifiers. For example, a ratio of three (e.g., 3) can determine that for every one higher powered power amplifiers of the second set of power amplifiers, three lower powered power amplifiers of the first set of power amplifiers are activated or connected within the phased array device 100 for transmission. Other ratios and power amplifier combinations of the communication array 110 can also be utilized, dynamically or fixedly, based on one or more predetermined criteria. The predetermined criteria, for example, can be a parameter related to the input RF signal, a signal peak of the signal, an efficiency of a combination of at least two power amplifiers of the communication array 110, an output power, a saturation power level, a peak efficiency of the communication array 110, a back-off power point/level, beam-forming gain, or other related parameter.

In addition or alternatively, in order to communicate the data signals as millimeter wave signals in air, the communication array 110 can also comprise different sub-arrays comprising one or more different combinations of the first set of power amplifiers or the second set of power amplifiers, which can also be replicated throughout the communication array 110. Each sub-array can be replicated any number of times within the communication array 110. In one aspect, a first sub-array and a second sub-array of power amplifiers can be used to transmit output signals in space at different antenna 112 in order to generate or re-construct an original amplitude- and phase-modulated signal 116 in air based on unequal array/sub-array configurations. The different sub-arrays can comprise power amplifiers based on the predetermined ratio with the same or different operational parameters for optimally transmitting and combining the signal in air.

The antennas 112 illustrate at least two different signal transmissions at predetermined angles or vectors in space or air, which are transmitted from the phased array device 100 and then externally combined. The communication array 110 of the phased array device can be configured to transmit signals externally from the device and form a combined signal as a reconstructed signal with a desired amplitude and phase in air or a space medium. The phased array device 100 therefore generates the amplitude- and phase-modulated signal 116 in air or space with the antenna 112 at one or more predefined beamforming angles, which is also based on the unequal communication array 110 with the various aspects being described herein.

Figure 2:
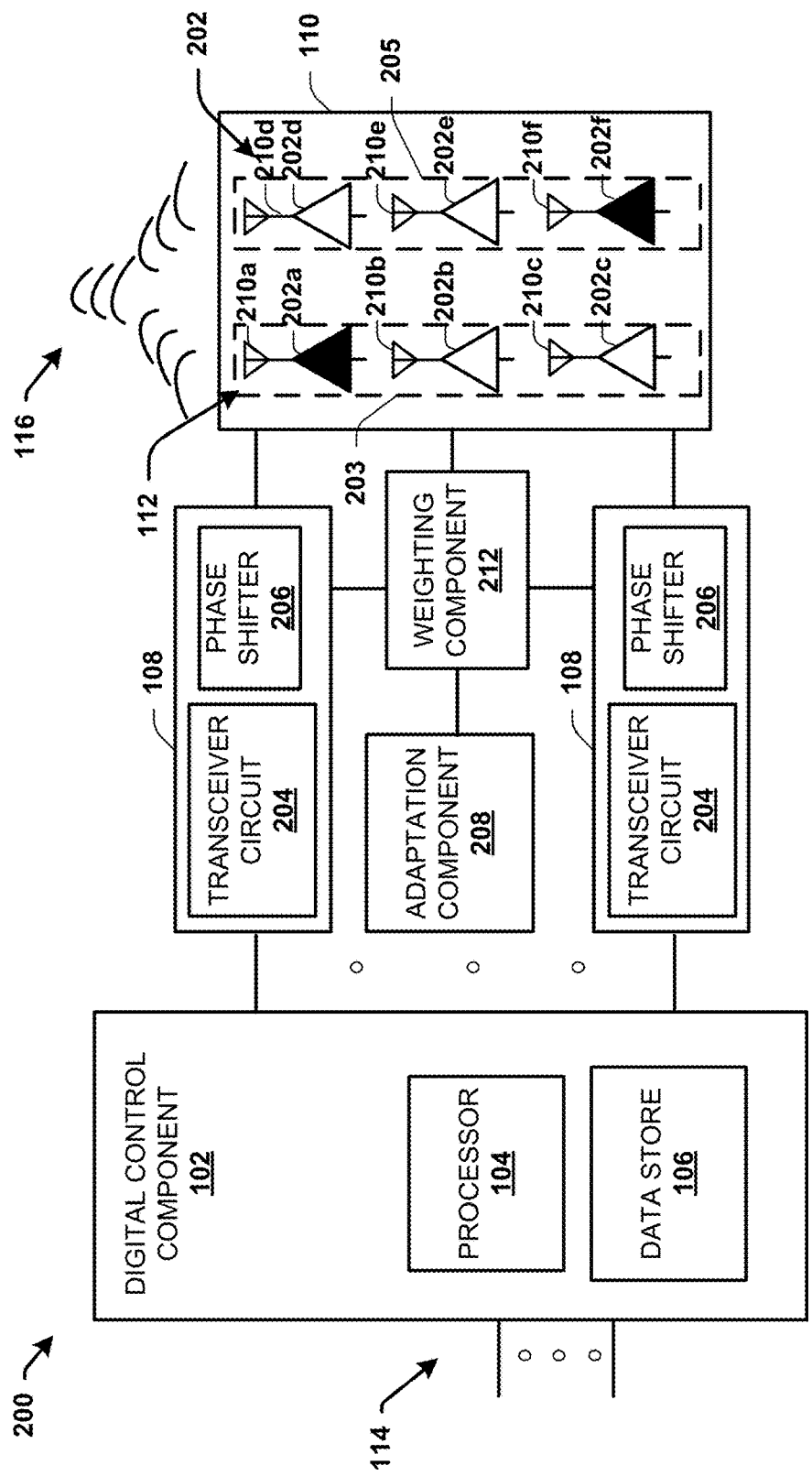
FIG. 2 is a block diagram illustrating another phased array system or device according to various aspects disclosed.

Referring now to FIG. 2, illustrated is another example of a mmW phased array system in accordance with various aspects being disclosed. The phased array system 200 includes the communication array 110 coupled to one or more processing chains 108 and a digital control component 102, as described above. The processing chains 108 can comprise components including a transceiver circuit 204 and a phase shifter 206, respectively, as well as one or more other components, for example. The system 200 can also include an adaptation component 208, a weighting component 212 and a plurality of transmission units 202 of the communication array 110.

The digital control component 102 can process one or more data signals with the processor 104 (e.g., a baseband processor or the like) to process and communicate via the phased array system 200. The processor chains 108 can include a plurality of transceiver, transmitter, or receiver chains that correspond to one or more antenna elements 210a-210f. The processor chains 108 can include various processing components for processing a signal with a relative, corresponding phase to the particular processing chain. The processing chains 108 can include one or processing components, filters, signal shaping elements, digital-to-analog converters, analog-to-digital converters, receiver circuit elements, transmitter elements, couplers, switches, other signal processing components, or the like. The processing chains 108 respectively comprise a transceiver circuit 204 and a phase shifter 206 to process (e.g., generate or receive) a phase shifted signal relative to one another, in which each chain 108 processes a different phase shift with respect to one another and according to a predefined angle, or a dynamically determined angle for the reconstructed signal 116 to be transmitted in an air medium.

The reconstructed signal 116 can include both Quadrature (Q) and In-phase (I) components. In one example, the Q and I components can be integrated together prior to the re-construction/combination in air, so the reconstructed signal 116 is modulated with different signals having both Q and I components and different signals can be radiated or transmitted in air for beamforming in space. Alternatively or additionally, each reconstructed signal can include either a Quadrature component signal or an In-phase component signals, for example, that form the reconstructed signal 116.

The transceiver circuit 204 of each chain 108 can comprise a transmitter or a receiver device for communication of phased array signals via the communication array 110. Each chain 108 can further comprise a phase shifter 206 configured to shift a phase and vary the data signals in millimeter wave frequencies from one another so that the effective radiation pattern of the communication array 110 is reinforced in a desired direction and suppressed in an undesired direction.

The communication array 110, for example, can include an array of transmission units 202 or power amplifiers with antennas, in which each transmission unit 202 comprises a power amplifier 202a and an antenna 210a, for example. The power amplifiers 202a-202f are coupled to, or correspond with respective antennas 210a-210f, which can vary, or be uniform in architecture, number or beam forming function relative to one another. The antennas 210a-210f, for example, can include different planar, segmented or various shaped antenna or be uniform along the communication array 110. In one aspect, the communication array 110 can comprise different sub-sets or arrays of transmission units 202 for transmitting signals. Two sub-arrays 203 and 205 of transmission units 202 are illustrated as part of the communication array 110. However, the communication array 110 can comprise a different number of sub-arrays with a different amount of transmission units 202 as part of each array. For example, the sub-array 203 is illustrated with three transmission units, but more or less transmission units 202 can also be envisioned. In addition, the sub-array 203 can comprise a different number of transmission units 202 than the sub-array 205, so that instead of each sub-array having three transmission units 202 one sub-array can have more or less transmission units 202 than the other sub-array, for example.

In another aspect, the communication array 110 can be an unequal array of transmission units 202 so that the transmission units 202 can have different kinds of power amplifiers 202a-202f, which are not equal in specifications to one another for beamform mmW frequency communications in an air medium. For example, the power amplifiers 202a and 202f, which are bolded, can comprise different power saturation levels (Psat), or peak operational power levels, than the power amplifiers 202b, 202c, 202d, and 202e. In addition, the communication array can be an unequal array because the power amplifiers of the transmission units 202 are unequal in their operational parameters, such as by having different output/transmission powers for creating the combined signal 116 in the air.

In one example, the transmission units of each sub-array 203 and 205 can have a ratio of stronger power amplifiers 202a and 202f (bolded) to weaker power amplifiers 202b, 202c, 202d, and 202e (not bolded). Thus, the stronger power amplifiers 202a and 202f can have a higher peak power than the weaker ones. Alternatively or additionally, the stronger power amplifiers can have a higher output power for signal transmission than the weaker power amplifiers 202b, 202c, 202d, and 202e. While power amplifiers 202a and 202f comprise higher peak power or output power compared to the power amplifiers 202b, 202c, 202d, and 202e, other power amplifiers can also be located within the array at peak power levels and output powers that are different from the stronger power amplifiers and the weaker ones, such as power amplifiers that have a higher peak level than others, a lower peak level than others, an intermediate level that is between the higher and lower level, or different transmission output power levels than the power amplifiers of the transmission units 202.

The sub-arrays 203 and 205 can also be further replicated with respect to one another to activate or connect different sub-arrays with the same configuration or same number of transmission units 202 (e.g., a same ratio of stronger to weaker power amplifiers) or sub-arrays with a different configuration/number/ratio. As such, these sub-arrays can be dynamically activated based on different beam forming parameters as a function of the bandwidth of the data input signal 114, other predetermined criteria related to the data input signal (amplitude, phase, frequency, etc.), beam forming criteria related to a predetermined angle (phase shifting, beamforming weights, etc.), or other parameters for generating a reconstructed signal in air with the communication array 110.

The unequal communication array 110 can utilize over-the-air summation to create the desired signal more efficiently than a uniform array where the power amplifiers are equal in size (Psat) and output power (Pout), and different signals transmitted from the antennas 112 are summed to reconstruct processed signals. The phased array system 200 provides signal peaks of the data input signals 114 and transmits them through different power amplifiers 202a-202f of the communication array 110, which is optimized for the power to transmit efficiently. The different signals can them be summed in air in order to generate an effective radiation pattern in air that is reinforced in a desired direction and suppressed in undesired directions, for example In one example, the phased arrays system 200 implements a trade-off between the peak power of the communication array 110 and a back-off power level from the peak power, while increasing total array efficiency. The phased array system 200, for example, selects or generates an optimal combination of activated, or connected, strong power amplifiers (e.g., power amplifiers 202a) with respect to weak amplifiers (e.g., 202b) of operating processing chains 108 that increases a total power efficiency in comparison to an array with uniform power amplifiers, which is achieved with a same number of total processing chains 108 being activated or configured in the system 200. Additionally or alternatively, the communication array could dynamically activate or couple uniform power amplifiers in the array with same power specifications/parameters to the one or more processing chains 108.

In one aspect, the system 200 includes the adaptation component 208 that is configured to selectively activate the unequal array of power amplifiers 202a-202e to process one or more data input signals 114 via the array of antennas 112 based on a set of predetermined criteria. For example, the set of predetermined criteria can include a signal peak level of the data signal 114, a total transmission power efficiency of a combination of at least two power amplifiers or transmission units 202, an output power of the system or the power amplifier(s), a saturation power level, a back-off point/amount or the like, of a power amplifier, a transmission unit or an array thereof. The adaptation component 208 can be configured to select a combination of the power amplifiers 202a-202f or transmission units 202 from the unequal communication array 110 to dynamically, or statically, increase a transmission power efficiency corresponding to a transmission of a data input signal 114 or an overall power efficiency of the communication array 110. For example the adaptation component 108 can operate to selectively activate, or couple, power amplifiers 202a-202f, or transmission units 202 to increase an overall array power efficiency based on a back-off target level from the peak power.

Additionally or alternatively, the adaptation component 108 can selectively activate, or couple (e.g., via switches, variable links, powering or the like) power amplifiers 202a-202f based on a predetermined ratio of a first number of power amplifiers 202b-202e to a second number of power amplifiers 202a and 202f, in which the first number of power amplifiers 202b-202e comprise a lower peak power level or transmission power level than the second number of power amplifiers 202a and 202f. In another embodiment, the adaptation component 108 can generate a tradeoff between a peak power efficiency and a back-off power efficiency to increase a total power efficiency of the unequal communication array 110 for transmitting or processing one or more different signals based on one or more predetermined criteria.

In another aspect, the weighting component 212 can be configured to provide signal phase weights or gain weights to the processing paths 108, but can also be configured to facilitate weighting, or ranking, one or more combinations of power amplifiers 202a-202f of the unequal communication array 110 based on an efficiency power boosting range. In order to optimize the array efficiency of the communication array 110, the predetermined criteria discussed above can be utilized for dynamically beam forming data signals 114 with unequal weighting of the transmission units 202 to boost the total efficiency. The weighting component 212 can operate to provide different weights to transmission units 202, different combinations of transmission units or to different sub-arrays, for example, based on the predetermined criteria.

In response to the adaptation component 208, for example, the weighting component 212 can rank different sub-arrays of the communication array, different predetermined ratios, or combinations of activated stronger power amplifiers with weaker or less powerful power amplifiers. For example, the combinations can be ranked and weighted according to the rank in order to process a diversity of data signals (e.g., different carrier components) concurrently or differently based on current communication conditions or resources available. For example, a multiple user or single user device, such as a multiple-input multiple-output (MIMO) device, a multiple input single output device (e.g., wireless system 1100 of FIG. 11), or the like can operate based on different weighting of different power amplifiers, or sub-arrays based on an output of the adaptation component 208. The weighting component 212, for example, can take into account criteria such as beam-forming gains for each user or input data signal, as well as the total array/sub-array efficiency, or transmitter/receiver efficiency.

In one example, the total power of the array can be approximately expressed as:
$P_{tot\_rx}=(\sqrt{P_1}+\sqrt{P_2}+\ldots+\sqrt{P_n})^2$ (Eqn. 1), where the total power (P) at the receiver ($P_{tot\_rx}$) is a sum of the transmitted fields, each being the square root of the transceiver power (e.g., $\sqrt{P_n}$). In addition, the efficiency of the array ($\eta_{array}$) can be approximated as follows:

$$\eta_{array} = \frac{P_{tot\_rx}}{N \cdot P_{DCtot\_rx}} = \frac{(\sqrt{P_1}+\sqrt{P_2}+\ldots+\sqrt{P_n})^2}{N \cdot \left(\sqrt{P_{max1} \cdot P_{out1}} + \sqrt{P_{max2} \cdot P_{out2}} + \ldots + \sqrt{P_{maxn} \cdot P_{outn}}\right)};$$ (Eqn. 2)

in which each power amplifier of each processing chain can be assumed to behave according to a class of amplifiers, such as approximately to a class B, for example, and the powers are express as peak (max) powers and transmission powers according to a number N (the ratio or array replication number of amplifier elements or transmission units).

In one example, the phase array systems or phased array (e.g., communication array 110) described herein can have N transmission units 202 that are equal in maximum powers ($P_m$), in which N is an integer of at least two, and another number of transmission units with a different peak power ($P_{mx}$). The back-off point or level can thus be defined as the point where a single element (e.g., transmission unit, or power amplifier alone) is off, or inactivated, and the power of the array (e.g., communication array 110) derives from the N transmission units that are weaker or smaller than others, such as with the weaker set of power amplifiers. The following equations can further approximate a peak power and an array efficiency:
$P_{mx}=N^2 \cdot (\sqrt{BO}-1)^2 \cdot P_m$ (Eqn. 3); wherein BO is a back-off point or back off from a peak power, for example;

$$\eta_{array} = \frac{N \cdot (\sqrt{\beta}+\sqrt{\alpha} \cdot (\sqrt{BO}-1))^2}{(N+1) \cdot (\sqrt{\beta}+N(\sqrt{BO}-1))^2 \cdot \sqrt{\alpha}};$$ (Eqn. 4)

in which the total array efficiency compared to input power is divided into two power boosting ranges. The two ranges, for example, can be expressed as follows:
$0<\alpha<1$, $\beta=1$—for the range of max power until BO; and
$\alpha=0$ $0<\beta<1$—for the range BO till 0.

Figure 3:
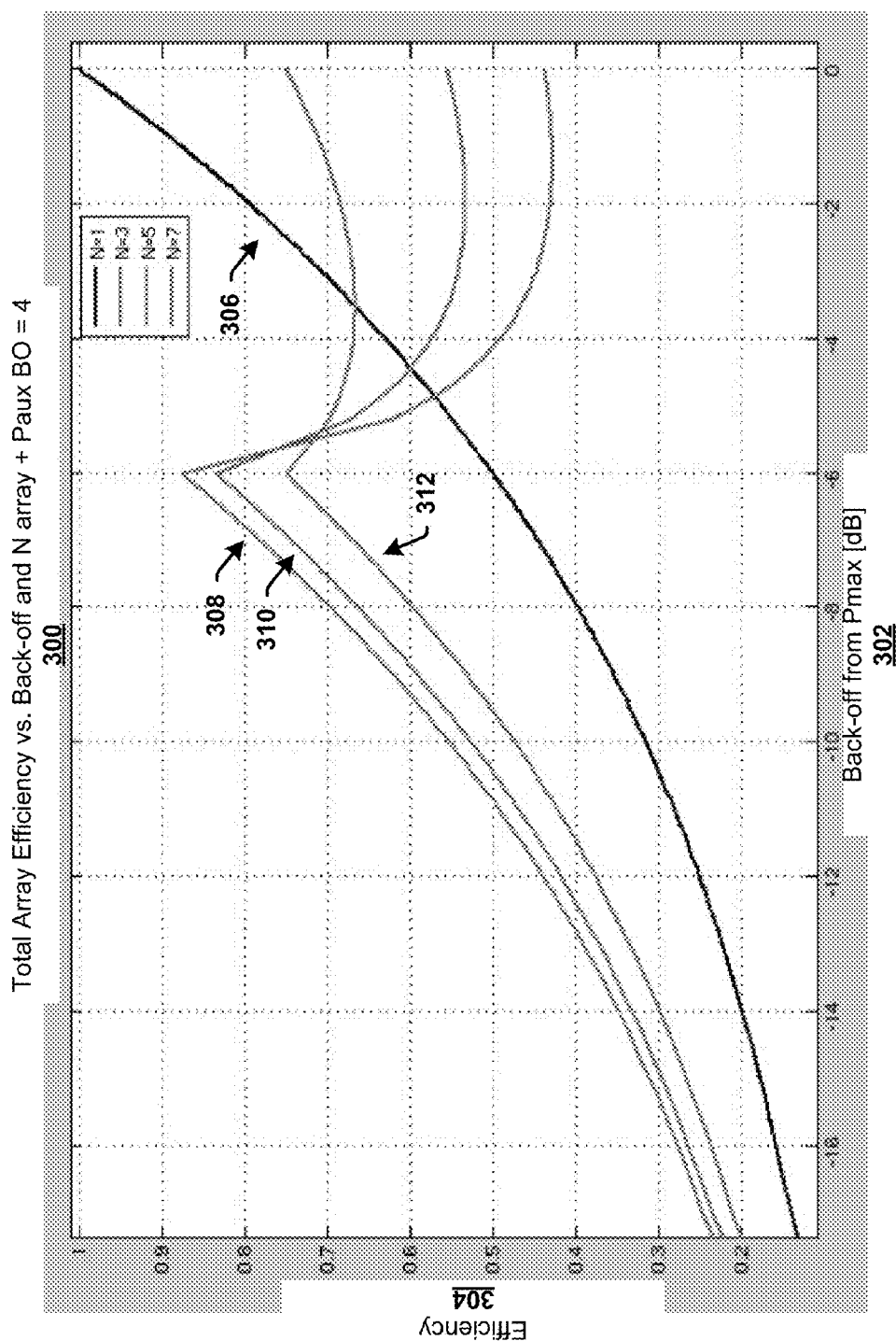
FIG. 3 is a graph illustrating a set of efficiency curves with respect to back-off points in a phased array according to various aspects disclosed.

Referring to FIG. 3, illustrated is a graph of a phased array system in accordance with various aspects described herein. The graph 300 illustrates, for example, the efficiency of the communication array 110 for specific example ratios of activated or coupled power amplifier combinations. The graph 300 comprises efficiency curves 300 with back-off (BO) to fit an optimum actual transmitted signal and power. The back-off from Pmax 302 as the maximum power for the array 110 is represented along the x-axis, while the total efficiency 404 is expressed along the y-axis. The phased array systems and devices described herein can operate to facilitate a trade-off (e.g., via the adaptation component 208 or weighting component 212) that can be seen between the peak power (Psat) and the back-off power from peak power of the communication array 110, for example. The back-off efficiency can be raised by approximately 50% or greater as a result of the communication array 110 being configured or activated with the predetermined ratio of power amplifiers. The back-off can be referred to as a point or level where a single power amplifier is deactivated or powered off and all of the power from the communication array 110 results from only weaker power amplifiers. A power efficiency can be raised with an increase in back-off from zero (a low or no back-off from peak power) toward about −6 dB. As such, a back-off level/amount of 6 dB, as such, increases efficiency; however, reduces the peak efficiency by about the same amount for the communication array 110 comprising a ratio of weaker power amplifiers (e.g., 202b to 202e) to stronger power amplifiers (e.g., 202a or 202f) of N=3, at curve 312, for example. The other curves can also be demonstrated at N=1 at curve 306, compared with N=7 at curve 308 and also N=5 at curve 310. The phased array thus implements a trade-off, as illustrated, to optimize the total efficiency of the communication array 110 based on the ratio of weaker power amplifiers being activated to stronger power amplifiers for optimal transmissions.

Figure 4:
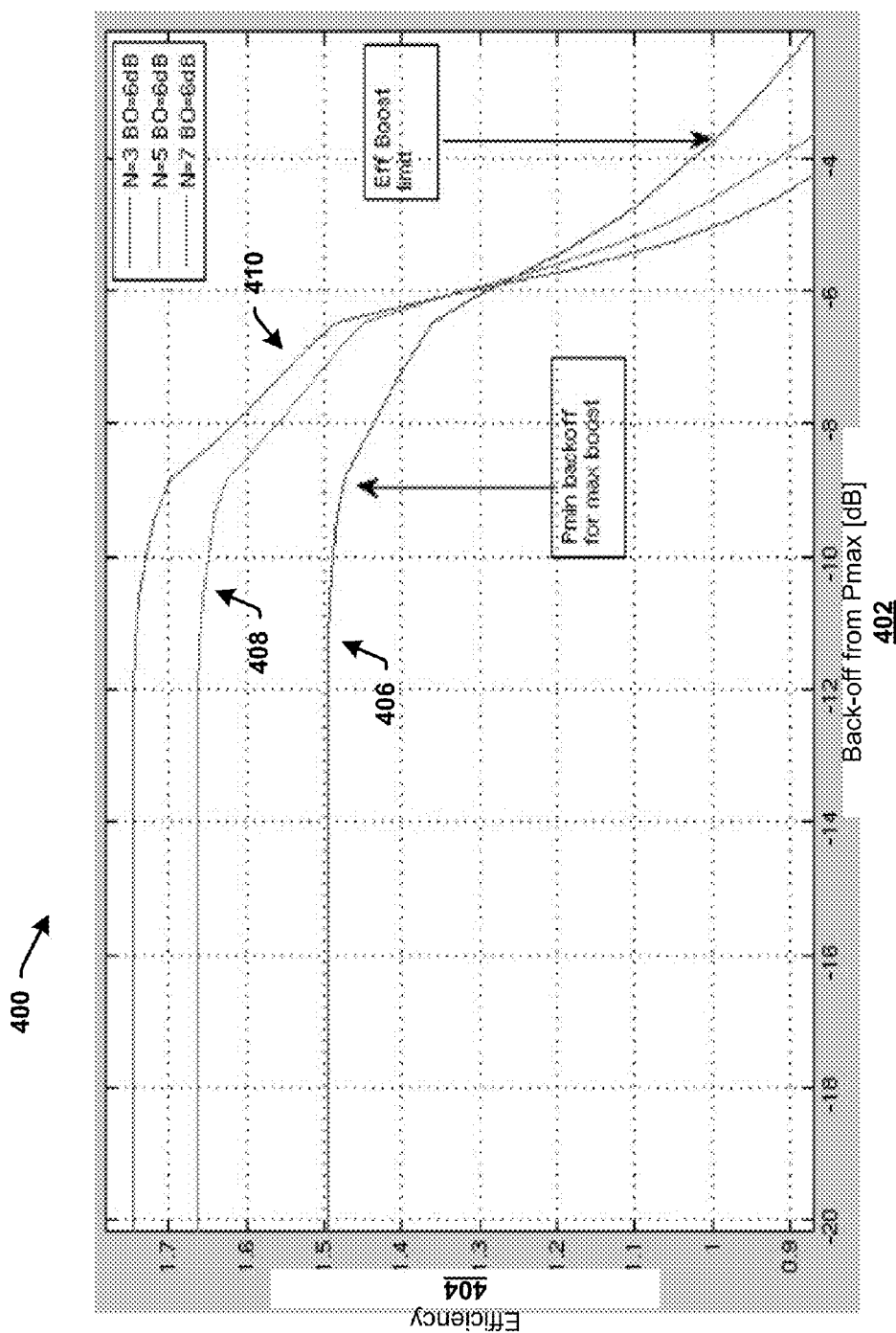
FIG. 4 is another graph illustrating a set of efficiency curves with respect to back-off points for a WiGig packet in a phased array according to various aspects disclosed.

Referring to FIG. 4, illustrated is another example of a graph in accordance with various aspects being described. The graph 400 efficiency boost calculations with the actual efficiency boost of a transmitted WiGig packet with different ratio combinations of different power amplifiers configured in the communication array 110. The curve 406 illustrates the actual total efficiency boost for WiGig packets compared to a transmit power back-off, in which the ratio of weaker power amplifiers to stronger power amplifiers activated in a communication (phased) array 110 is N=3. The curves 408 and 410 represent the same with N being equal to a ratio of 5 and 7, respectively.

In one example for N=3 at curve 406, a benefit can be obtained from an efficiency boost of up to 4 dB back-off and reaching optimum boost or peak at approximately 9 dB back-off. The phased array systems being described can operate to transmit beyond 4 dB back-off from Psat even for low rates due to mask limits, for example. For high PAPR signal rates (e.g., QAM16) an 8 dB back-off or more can be generated from Psat where a majority of the boosting is achieved.

Figure 5:
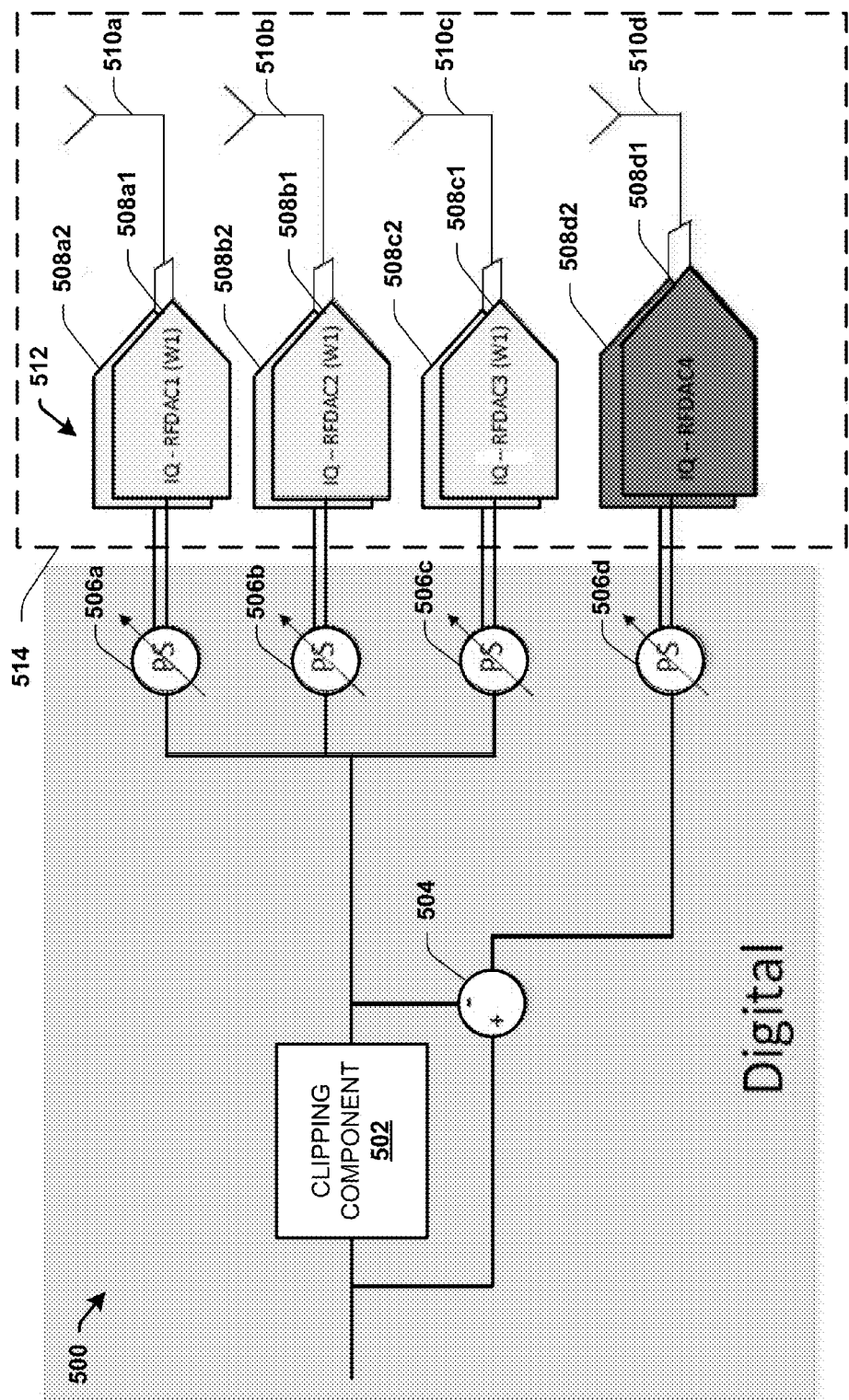
FIG. 5 is a block diagram illustrating another phased array system or device according to various aspects disclosed.

Referring to FIG. 5, illustrated is another example of a phased array system in accordance with various aspects for millimeter wave systems (e.g., 60 GHz or 5G systems). In this example configuration, a phase array system 500, similar in aspects to the phased array systems described above, comprises a communication array 514 having transmission units 512 for driving signal transmissions with high PAPR signals (e.g., OFDM signals or other such signals) in air or space to form a re-constructed or combined signal over the air.

The transmission units 512 are similar to the transmission units 202 disclosed above, and the array 514 to the array 110, comprising similar features and aspects being disclosed, but further comprising RF digital-to-analog converters to provide the functions and aspects of the power amplifiers 202a-202f. The digital-to-analog converters (DACs) 508a1, 508a2, 508b1, 508b2, 508c1, 508c2, 508d1, and 508d2 operate to drive signal transmissions from conversions of digital signals to analog signals with different peak powers and output powers. The DACs 508a1-508d2 can operate to convert RF data signals to mmW signals and operate with up-converters, filters, or provide corresponding operations thereof. For example, the DACs 508a1-508d2 can also include a up-converter circuit, a pre-driver, or mixer interface that provides a voltage swing via one or more transistors being coupled together (e.g., coupled at drains to another transistor or by another configuration).

Each transmission with a corresponding antenna 510a-510d, for example, can comprise a combination of Q and I components that are transmitted over air, or in space, at a predefined angle to generate a reconstructed signal with one or more other transmitted signals from the communication array 514 in an air or space medium. For example, Q and I components of data signals can each be processed according to a weighted phase shift at a corresponding phase shifter 506a-506d, in which phases of signals to the array are shifted in order to facilitate a beam-forming vector for transmitting via the communication array 514. In one example, the Q and I components can be processed via different DACs, such as the DAC 508a1 processing a Q component and the DAC 508a2 processing the I component, or alternatively, the two can be combined previously and processed by the same DAC, in which at least two DACs can correspond to the same phase shift generated by the phase shifters 506a through 506d as illustrated. The phase shifts can vary in order to generate the desired beamforming in the air medium.

In another aspect, a clipping component 502 can be configured to receive one or more signals from processing chains described above and clip the peak signals from the processed data signals. The clipping component 502 can then provide the clipped signals to transmission units via phase shifter 506a, 506b and 506c. These phase shifters 506a, 506b and 506c then provide the phase shifted signals to the RF digital-to-analog converters 508a1, 508a2, 508b1, 508b2, 508c1, 508c2. These converters 508a1 to 508c2 can have different output powers and peak powers compared to the converters 508d1 and 508d2. The system 500 can operate to provide a trade-off between the peak power of the array 514 and a back-off power similar to the systems described above. Although the architecture of the system 500 is illustrated with an 8 by 1 array of six digital to analog converters (DACs) with lower transmission output powers and peak powers 508a1 to 508c2 and two with higher transmission output powers and peak powers, other ratios of DACs for an unequal communication array can also be envisioned according to various aspects being described herein.

The communication (phased) array 514 can operate to provide an efficiency boosting range based on the structural configuration or activation of a combination of differing driver units of the transmission units (e.g., the power amplifiers 202a to 202f, the DACs 508a1 to 508d2, or other power transmission chains or components). Weighting optimizations, such as performed in the weighting component 212 or externally for a fixed array architecture, can indicate significantly improved solutions for large arrays (for the back-off target and the ratio between the higher peak power amplifiers (PAs) and the lower power PAs). For various unequal arrays, the activated, coupled or configured communication array can be replicated based on the chosen unit cell combination.

For example, a communication array 514 with thirty-six transmission units, with nine stronger powered units (PAs, DACs, or the like) and twenty-seven weaker ones, the ratio is N=3, which can be activated, configured or coupled to transmit millimeter wave signals to reconstruct these signals in a space medium for a phase- and amplitude modulated signal for communicate data. The thirty-six unit array, for example, can have the stronger nine transmission units with driving components (e.g., PAs, DACs or the like) and peak powers at Psat by 9.5 dB, which can be 5.5 dB stronger than a uniform or equal array, where the transmission units have equal specifications/parameters, with the same equivalent isotropically radiated power (EIRP). The unequal communication array 514 can provide a 50% efficiency improvement over the transmit power levels of high constellation WiGig signals with an equal array configuration.

$$\eta_{boost\_BO} = \frac{2 \cdot N}{(N+1)}. \qquad (Eqn.\ 5)$$

$$P_{mx} = N^2 \cdot P_m. \qquad (Eqn.\ 6)$$

$$P_{my} = \left(\frac{N}{(N+1)}\right)^2 \cdot 4 \cdot P_m, \qquad (Eqn.\ 7)$$

where $P_{my}$ is the transmission power for an equal array of transmission units (PAs, DACs, or the like) and a same total EIRP. The above example with Eqns. 5-7 can be approximated, for example, as follows: $\eta_{boost\_BO}{=}_{N=3}1.5$ (+50%); $P_{mx}{=}_{N=3}9 \cdot P_m(9.5\ dB)$; $P_{mx}{=}_{N=3}2.5 \cdot P_m(4\ dB)$.

The above communication array 514 can be implemented for the future evolution of the digital array implementation for millimeter wave (mmW) systems for the 60 GHz and 5G standards and related wireless procedures. In the digital array, direct IQ RF DACs 508a1 to 508d2 can be utilized that convert the data streams inputted from RF to mmW per processing chain. In the unequal communication array 514, for example, an RF DAC can have larger switching units therein, in which for example can be nine times larger in this aspect. The peak slicing via the clipper component 502 can be thus performed in a more straight forward manner in the digital domain without further additional processing operations.

Figure 6:
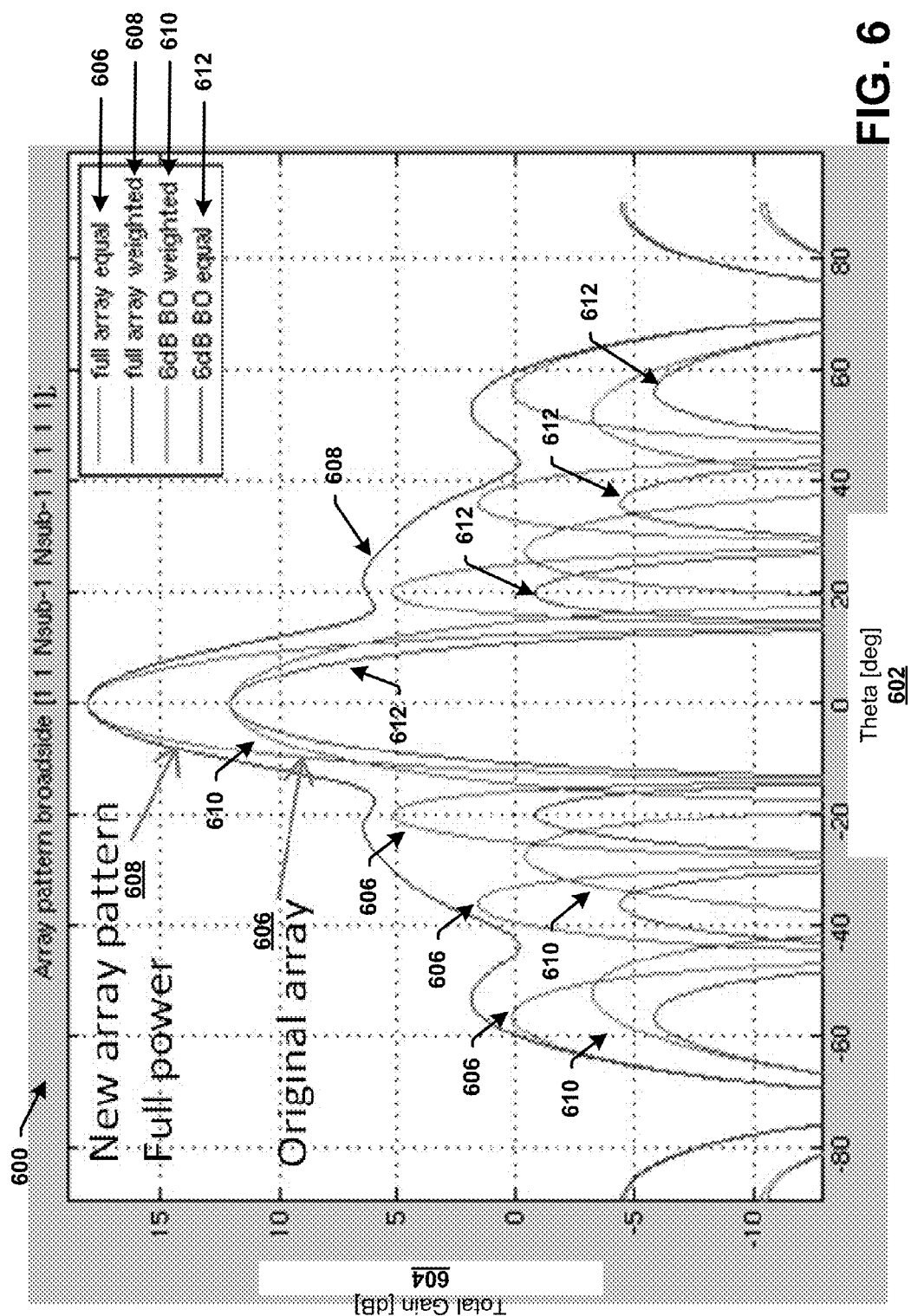
FIG. 6 is another graph illustrating beam pattern curves with respect to gain and beam angle from a phased array according to various aspects disclosed.

Referring now to FIG. 6, illustrated is a graph 600 according to mmW transmission of the communication array 514. Array patterns are illustrated that correspond to different pattern reference numerals, for example. The beam pattern for an equal communication array is illustrated as pattern 606. The beam pattern for a weighted, unequal, full power array is illustrated as pattern 608. The beam pattern for a weighted, unequal, array with a 6 dB BO is illustrated as pattern 610. The beam pattern for an equal array with 6 dB BO is illustrated as pattern 612. The communication array 514 is an example with an 8×1 array having four transmission units replicated twice, in which three are weaker and one is stronger for each sub-array or replication. The unequal array can be compared to an array with equal power specification in the units.

Figure 7:
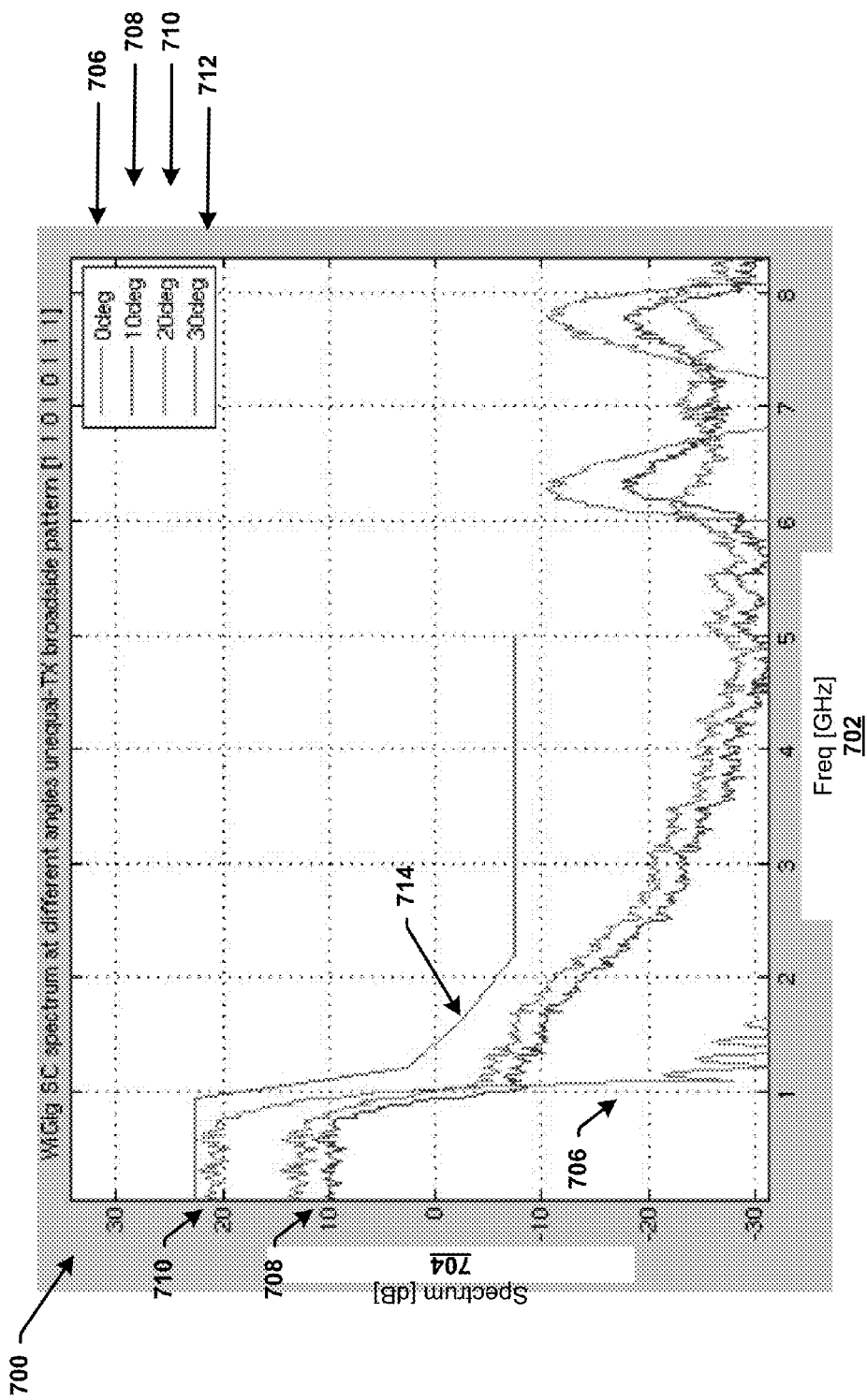
FIG. 7 is another graph illustrating spectrum curves with respect to frequency from a phased array according to various aspects disclosed.

In addition to the spatial gain change, there is also a spectral emission change with a spatial positioning of transmission units 512 within the communication array 514, in which activated, or coupled, transmission (array) units corresponding to the ratio at different spatial positioning can change the spectrum. In one example, FIG. 7 illustrates a graph 700 of the WiGig spectrums at different angles from the intended target with respect to a Federal Communications Commission (FCC) violation. The horizontal axis represents a frequency in GHz 702 and the vertical axis represents the spectrum in dB 704. For example, the spectrum curve 706 illustrates the WiGig spectrum at zero degrees. The spectrum curve 708 illustrates the WiGig spectrum at 10 degrees. The spectrum curve 710 illustrates the WiGig spectrum at 20 degrees, and a spectrum curve 712 illustrates the WiGig spectrum at 30 degrees, which is not seen. The FCC violation line is illustrated by the FCC violation curve 714. As illustrated, at high angles the power of the main signal drops and the out of band emission increases. For the eight transmission units 510 arrangement chosen and over all the angles, there is no violation that exceeds the FCC violation line of the mask and regulatory requirements (for a 10 dBm transmission and 15 dBi antenna gain).

Figure 8:
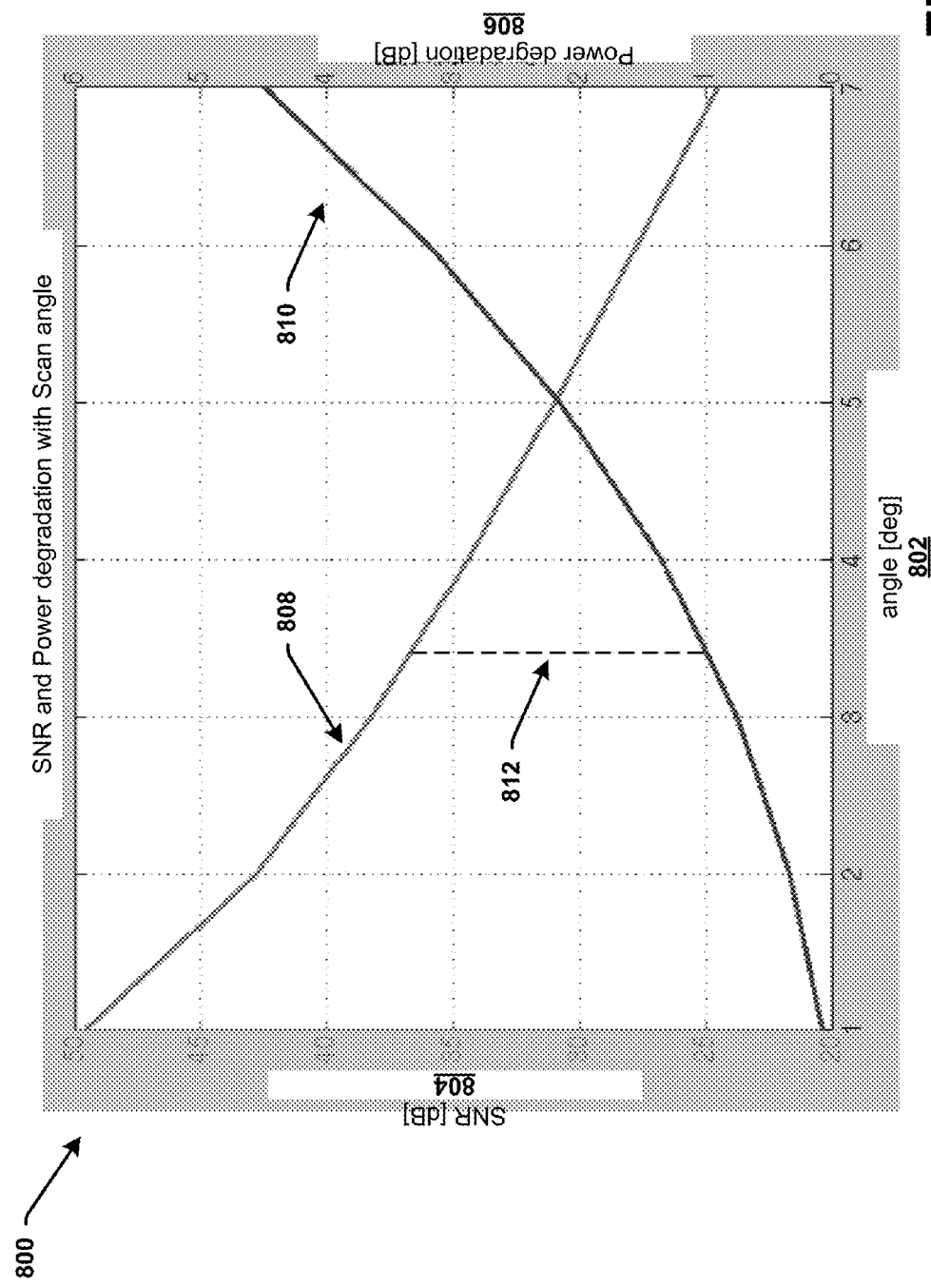
FIG. 8 is another graph illustrating a power curve and signal-to-noise curve with respect to angle from a phased array according to various aspects disclosed.

Referring to FIG. 8, illustrated is a graph 800 representing a signal-to-noise ratio (SNR) and a power degradation in accordance with various aspects. The horizontal axis 802 represents angles in degrees, while the vertical axis 804 represents an SNR in dB on the left side, and a vertical axis 806 represents power degradation on the right side. An SNR curve 808 illustrates an SNR drop with respect to an angle change. At the 1 dB point degradation line 812, a power drop curve 810 is defined by the array beam-width for 8 transmission units. The 1 dB point line 812 still provides a 37 dB SNR that is much higher than the total transmitter error vector magnitude (EVM) desired. These results demonstrate that the proposed system is robust and complies with FCC limits in the entire space.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 9:
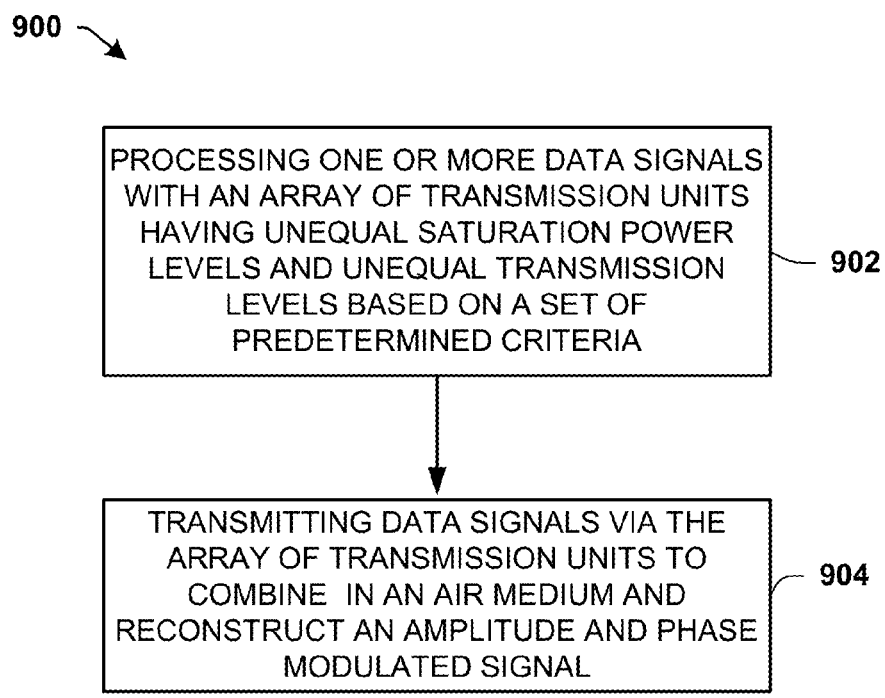
FIG. 9 is a flow diagram illustrating a method for a phased array according to various aspects disclosed.

Referring to FIG. 9, illustrated is an example method 900 for a millimeter wave communication device. The method initiates at 902 with processing one or more data signals with an array of power amplifiers having unequal saturation power levels and unequal transmission powers based on a set of predetermined criteria. At 904, the one or more data signals are transmitted, via an array of antenna elements coupled to the array of power amplifiers, at a predetermined angle that combines the one or more data signals in an air medium and reconstructs an amplitude and a phase modulated signal in the air medium. The set of predetermined criteria, for example, can comprise at least one of a signal peak of the one or more data signals, an efficiency of the array of power amplifiers, or a back-off power level.

The method can further comprise generating a tradeoff between a saturation power level and a back-off power level of at least one power amplifier of the array of power amplifiers to increase a transmission efficiency of the one or more data signals via the array of antenna elements coupled to the array of power amplifiers in a millimeter wave frequency band. Processing the one or more data signals with the array of power amplifiers can also include phase shifting the one or more data signals differently along signal or processing chains coupled to the array of power amplifiers, respectively. The one or more data signals can be communicated at a first output power range with a first set of power amplifiers of the array of power amplifiers at a back-off point from a first saturation power level. The one or more data signals can be communicated at a second output power range with a second set of power amplifiers of the array of power amplifiers at the back-off point from a second saturation power level. In this manner, the power amplifier array communicated the one or more data signals differently with power amplifiers of different power parameters or property. This can be done, for example, simultaneously or concurrently in the same phase array, for example to provide an increase in total efficiency through a trade-off of peak power and back-off power. For example, the second output power range can be greater than the second output power range, and the first set of power amplifiers comprises a greater number of power amplifiers than the second set of power amplifiers in the array of power amplifiers.

In another embodiment, the method 900 can further comprise selectively activating power amplifiers of the array of power amplifiers to increase an overall array power efficiency based on a back-off target level and a predetermined ratio of a first number of power amplifiers and a second number of power amplifiers of the array of power amplifiers, wherein the first number of power amplifiers comprise a lower peak power level than the second number of power amplifiers.

Figure 10:
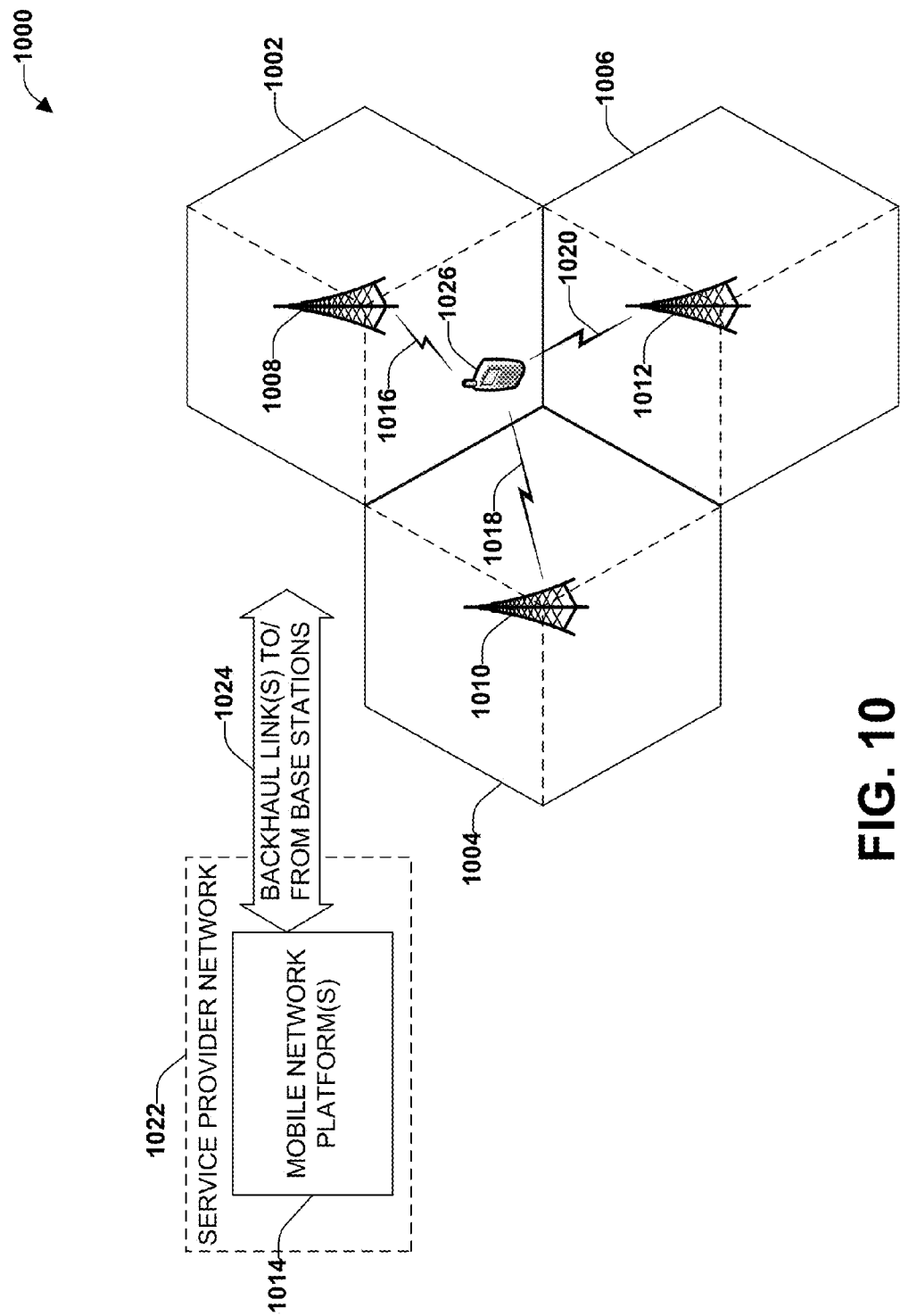
FIG. 10 is a schematic example of a wireless environment that can operate in accordance with aspects disclosed.

By way of further description with respect to one or more non-limiting environments to facilitate phased array networking, FIG. 10 is a schematic example wireless environment 1000 that can operate in accordance with aspects described herein. In particular, example wireless environment 1000 illustrates a set of wireless network macro cells. Three coverage macro cells 1002, 1004, and 1006 include the illustrative wireless environment; however, it is noted that wireless cellular network deployments can encompass any number of macro cells. Coverage macro cells 1002, 1004, and 1006 are illustrated as hexagons; however, coverage cells can adopt other geometries generally dictated by a deployment configuration or floor plan, geographic areas to be covered, and so on. Each macro cell 1002, 1004, and 1006 is sectorized in a 2π/3 configuration in which each macro cell includes three sectors, demarcated with dashed lines in FIG. 10. It is noted that other sectorizations are possible, and aspects or features of the disclosed subject matter can be exploited regardless of type of sectorization. Macro cells 1002, 1004, and 1006 are served respectively through base stations or eNodeBs 1008, 1010, and 1012. Any two eNodeBs can be considered an eNodeB site pair. It is noted that radio component(s) are functionally coupled through links such as cables (e.g., RF and microwave coaxial lines), ports, switches, connectors, and the like, to a set of one or more antennas that transmit and receive wireless signals (not illustrated). It is noted that a radio network controller (not shown), which can be a part of mobile network platform(s) 1014, and set of base stations (e.g., eNode B 1008, 1010, and 1012) that serve a set of macro cells; electronic circuitry or components associated with the base stations in the set of base stations; a set of respective wireless links (e.g., links 1016, 1018, and 1020) operated in accordance to a radio technology through the base stations, form a macro radio access network. It is further noted that, based on network features, the radio controller can be distributed among the set of base stations or associated radio equipment. In an aspect, for universal mobile telecommunication system-based networks, wireless links 1016, 1018, and 1020 embody a Uu interface (universal mobile telecommunication system Air Interface).

Mobile network platform(s) 1014 facilitates circuit switched-based (e.g., voice and data) and packet-switched (e.g., Internet protocol, frame relay, or asynchronous transfer mode) traffic and signaling generation, as well as delivery and reception for networked telecommunication, in accordance with various radio technologies for disparate markets. Telecommunication is based at least in part on standardized protocols for communication determined by a radio technology utilized for communication. In addition, telecommunication can exploit various frequency bands, or carriers, which include any electromagnetic frequency bands licensed by the service provider network 1022 (e.g., personal communication services, advanced wireless services, general wireless communications service, and so forth), and any unlicensed frequency bands currently available for telecommunication (e.g., mmW, the 2.4 GHz industrial, medical and scientific band or one or more of the 5 GHz set of bands, or otherwise). In addition, mobile network platform(s) 1014 can control and manage base stations 1008, 1010, and 1012 and radio component(s) associated thereof, in disparate macro cells 1002, 1004, and 1006 by way of, for example, a wireless network management component (e.g., radio network controller(s), cellular gateway node(s), phased arrays, etc.). Moreover, wireless network platform(s) can integrate disparate networks (e.g., Wi-Fi network(s), femto cell network(s), broadband network(s), service network(s), enterprise network(s), and so on). In cellular wireless technologies (e.g., third generation partnership project universal mobile telecommunication system, global system for mobile communication, mobile network platform 1014 can be embodied in the service provider network 1022.

In addition, wireless backhaul link(s) 1024 can include wired link components such as T1/E1 phone line; T3/DS3 line, a digital subscriber line either synchronous or asynchronous; an asymmetric digital subscriber line; an optical fiber backbone; a coaxial cable, etc.; and wireless link components such as line-of-sight or non-line-of-sight links which can include terrestrial air-interfaces or deep space links (e.g., satellite communication links for navigation). In an aspect, for universal mobile telecommunication system-based networks, wireless backhaul link(s) 1024 embodies IuB interface.

It is noted that while exemplary wireless environment 1000 is illustrated for macro cells and macro base stations, aspects, features and advantages of the disclosed subject matter can be implemented in micro cells, pico cells, femto cells, or the like, wherein base stations are embodied in home-based equipment related to access to a network (e.g., with one or more phased arrays or the like).

Figure 11:
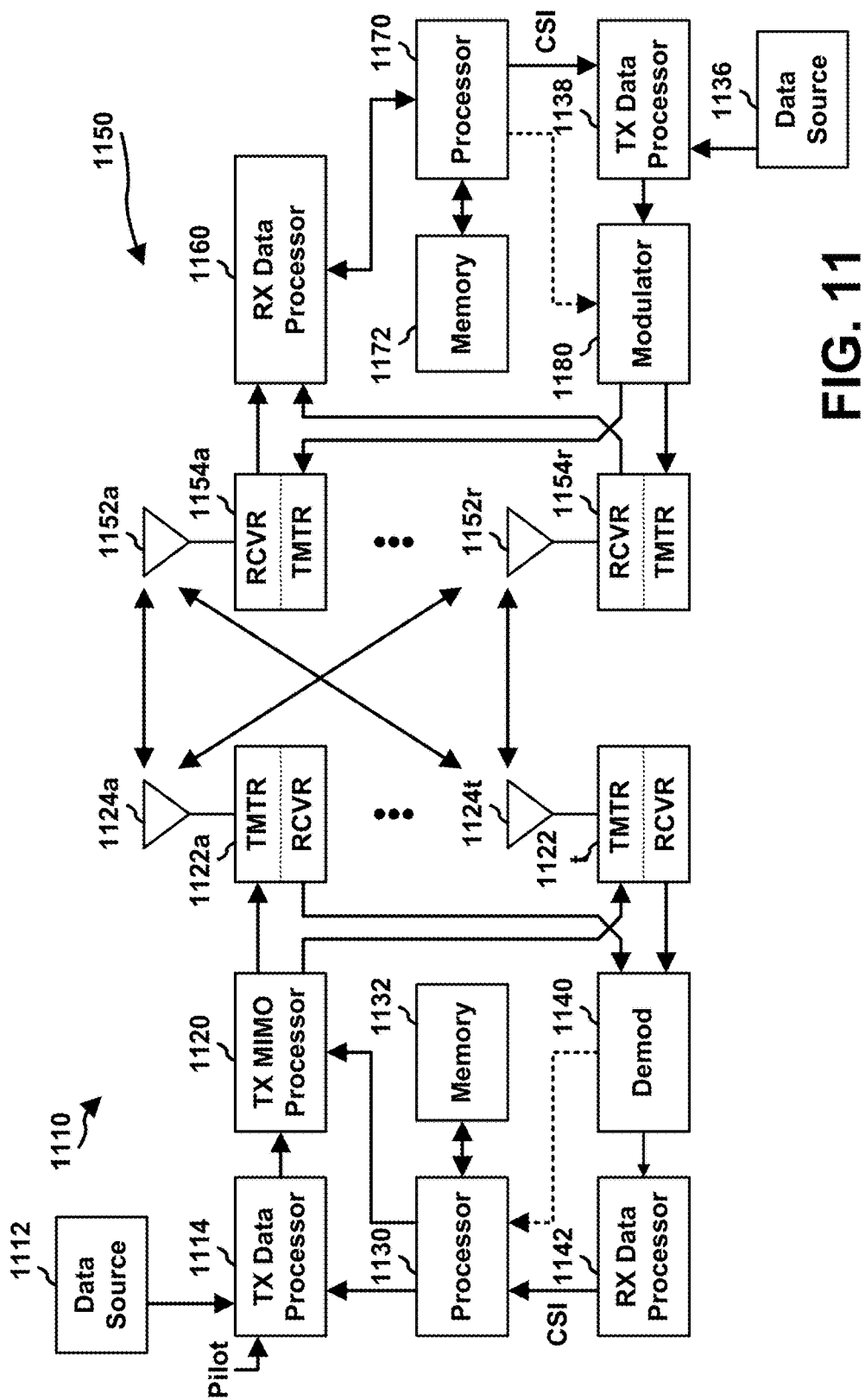
FIG. 11 is an illustration of an example wireless network platform to implement various aspects disclosed.

FIG. 11 illustrates one example of a wireless communication system 1100 that could also implement the components and aspects of a phased array as described above. The wireless communication system 1100 depicts one base station 1110 and one access terminal 1150 for sake of brevity. However, it is to be appreciated that system 1100 can include more than one base station and/or more than one access terminal, wherein additional base stations and/or access terminals can be substantially similar or different from example base station 1110 and access terminal 1150 described below. In addition, it is to be appreciated that base station 1110 and/or access terminal 1150 can employ the systems and/or methods described herein to facilitate wireless communication there between.

At base station 1110, traffic data for a number of data streams is provided from a data source 1112 to a transmit (TX) data processor 1114. According to an example, each data stream can be transmitted over a respective antenna. TX data processor 1114 formats, codes, and interleaves the traffic data stream based on a particular coding scheme selected for that data stream to provide coded data.

The coded data for each data stream can be multiplexed with pilot data using orthogonal frequency division multiplexing (OFDM) techniques. Additionally or alternatively, the pilot symbols can be frequency division multiplexed (FDM), time division multiplexed (TDM), or code division multiplexed (CDM). The pilot data is typically a known data pattern that is processed in a known manner and can be used at access terminal 1150 to estimate channel response. The multiplexed pilot and coded data for each data stream can be modulated (e.g., symbol mapped) based on a particular modulation scheme (e.g., binary phase-shift keying (BPSK), quadrature phase-shift keying (QPSK), M-phase-shift keying (M-PSK), M-quadrature amplitude modulation (M-QAM), etc.) selected for that data stream to provide modulation symbols. The data rate, coding, and modulation for each data stream can be determined by instructions performed or provided by processor 1130.

The modulation symbols for the data streams can be provided to a TX MIMO processor 1120, which can further process the modulation symbols (e.g., for OFDM). TX MIMO processor 1120 then provides $N_T$ modulation symbol streams to $N_T$ transmitters (TMTR) 1122a through 1122t. In various embodiments, TX MIMO processor 1120 applies beamforming weights to the symbols of the data streams and to the antenna from which the symbol is being transmitted.

Each transmitter 1122 receives and processes a respective symbol stream to provide one or more analog signals, and further conditions (e.g., amplifies, filters, and upconverts) the analog signals to provide a modulated signal suitable for transmission over the MIMO channel. Further, $N_T$ modulated signals from transmitters 1122a through 1122t are transmitted from $N_T$ antennas 1124a through 1124t, respectively.

At access terminal 1150, the transmitted modulated signals are received by $N_R$ antennas 1152a through 1152r and the received signal from each antenna 1152 is provided to a respective receiver (RCVR) 1154a through 1154r. Each receiver 1154 conditions (e.g., filters, amplifies, and downconverts) a respective signal, digitizes the conditioned signal to provide samples, and further processes the samples to provide a corresponding "received" symbol stream.

An RX data processor 1160 can receive and process the $N_R$ received symbol streams from $N_R$ receivers 1154 based on a particular receiver processing technique to provide $N_T$ "detected" symbol streams. RX data processor 1160 can demodulate, deinterleave, and decode each detected symbol stream to recover the traffic data for the data stream. The processing by RX data processor 1160 is complementary to that performed by TX MIMO processor 1120 and TX data processor 1114 at base station 1110.

A processor 1170 can periodically determine which available technology to utilize as discussed above. Further, processor 1170 can formulate a reverse link message comprising a matrix index portion and a rank value portion.

The reverse link message can comprise various types of information regarding the communication link and/or the received data stream. The reverse link message can be processed by a TX data processor 1138, which also receives traffic data for a number of data streams from a data source 1136, modulated by a modulator 1180, conditioned by transmitters 1154a through 1154r, and transmitted back to base station 1110.

At base station 1110, the modulated signals from access terminal 1150 are received by antennas 1124, conditioned by receivers 1122, demodulated by a demodulator 1140, and processed by a RX data processor 1160 to extract the reverse link message transmitted by access terminal 1150. Further, processor 1130 can process the extracted message to determine which precoding matrix to use for determining the beamforming weights.

Processors 1130 and 1170 can direct (e.g., control, coordinate, manage, etc.) operation at base station 1110 and access terminal 1150, respectively. Respective processors 1130 and 1170 can be associated with memory 1132 and 1172 that store program codes and data. Processors 1130 and 1170 can also perform computations to derive frequency and impulse response estimates for the uplink and downlink, respectively.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a phased array communication system comprising an array of transmission units comprising an unequal array of power amplifiers comprising a first power amplifier and a second power amplifier having different output powers and different saturation power levels corresponding to one another; and an array of antenna ports (or array of antennas), coupled to the unequal array of power amplifiers, configured to receive a plurality of input signals comprising different phases and gains in relation to one another. The array of transmission units is configured to generate, in an air medium, a combined signal by transmitting at least two signal outputs at a predetermined angle in the air medium to reconstruct an amplitude and phase modulated signal of at least one signal of the plurality of input signals.

Example 2 includes the subject matter of Example 1, further comprising a weighting component configured to weight combinations of power amplifiers of the unequal array of power amplifiers based on an efficiency power boosting range.

Example 3 includes the subject matter of any of Examples 1 and 2, including or omitting optional elements, wherein the unequal array of power amplifiers comprises a first number of first power amplifiers and a second number of second power amplifiers that comprise a higher saturation power level than the first number of first power amplifiers.

Example 4 includes the subject matter of any of Examples 1-3, including or omitting optional elements, wherein the first number of first power amplifiers is greater than the second number of second power amplifiers based on a predetermined ratio.

Example 5 includes the subject matter of any of Examples 1-4, including or omitting optional elements, further comprising an adaptation component configured to selectively activate the unequal array of power amplifiers to process the at least one signal of the plurality of input signals via the array of antenna ports based on a set of predetermined criteria.

Example 6 includes the subject matter of any of Examples 1-5, including or omitting optional elements, wherein the set of predetermined criteria comprises at least one of a signal peak of the at least one signal, an efficiency of a combination of at least two power amplifiers of the unequal array of power amplifiers, an output power of a power amplifier of the unequal array of power amplifiers, or a saturation power level of the power amplifier.

Example 7 includes the subject matter of any of Examples 1-6, including or omitting optional elements, wherein the adaptation component is further configured to select a combination of power amplifiers from the unequal array of power amplifiers to increase a transmission power efficiency corresponding to a transmission of the at least one signal and an overall efficiency of the array of transmission units.

Example 8 includes the subject matter of any of Examples 1-7, including or omitting optional elements, wherein the adaptation component is further configured to generate a tradeoff between a peak power efficiency and a back-off power efficiency to increase a total power efficiency of the unequal array of power amplifiers and the array of antenna ports for transmitting signals.

Example 9 includes the subject matter of any of Examples 1-8, including or omitting optional elements, further comprising a plurality of phase shifters coupled to the array of transmission units; and a clipping component, coupled to the plurality of phase shifters, configured to clip peak levels of the plurality of signals.

Example 10 includes a phased array device comprising: an unequal array of power amplifiers comprising a first set of power amplifiers and a second set of power amplifiers different from the first set of power amplifiers; and an array of antenna ports, coupled to the unequal array of power amplifiers, configured to transmit data signals having a phase and a gain that is from one another, into an air medium at a predetermined angle, and reconstruct an amplitude and a phase modulated signal in the air medium with the phase and the gain from at least two of the data signals being transmitted.

Example 11 includes the subject matter of Example 10, wherein the data signals include WiGig signals or 5G signals transmitted or received in a millimeter wave band.

Example 12 includes the subject matter of any of Examples 10 and 11, including or omitting optional elements, wherein the first set of power amplifiers is configured to communicate the data signals at a first output power range and operate at a first saturation power level, and the second set of power amplifiers is configured to communicate the data signals at a second output power range and operate at a second saturation power level that are different from the first output power range and the first saturation power level.

Example 13 includes the subject matter of any of Examples 10-12, including or omitting optional elements, wherein the second set of power amplifiers of the unequal array of power amplifiers comprises a higher saturation power level than the first set of power amplifiers of the unequal array of power amplifiers.

Example 14 includes the subject matter of any of Examples 10-13, including or omitting optional elements, further comprising: an adaptation component configured to selectively activate the first set of power amplifiers and the second set of power amplifiers to communicate the data signals based on a power efficiency target and a back-off power point.

Example 15 includes the subject matter of any of Examples 10-14, including or omitting optional elements, wherein the back-off power point is about 8 dB or greater from a peak saturation power of the first set of power amplifiers and the power efficiency target is approximately 50% or greater.

Example 16 includes the subject matter of any of Examples 10-15, including or omitting optional elements, further comprising a plurality of processing chains, coupled to the unequal array of power amplifiers and the array of antenna ports, comprising: an I/Q RF digital-to-analog converter configured to convert the data signals from a radio frequency to a millimeter wave frequency; and a set of switching units configured to connect at least one first power amplifier of the first set of power amplifiers and at least one second power amplifier of the second set of power amplifiers.

Example 17 includes the subject matter of any of Examples 10-16, including or omitting optional elements, wherein the first set of power amplifiers and the second set of power amplifiers comprises a ratio of 1 to N in number that is replicated throughout the unequal array of power amplifiers, wherein N is an integer of at least 2.

Example 18 is a method for a millimeter wave communication device comprising: processing one or more data signals with an array of power amplifiers having unequal saturation power levels and unequal transmission powers based on a set of predetermined criteria; and transmitting the one or more data signals, via an array of antenna ports coupled to the array of power amplifiers, at a predetermined angle that combines the one or more data signals in an air medium and reconstructs an amplitude and a phase modulated signal in the air medium.

Example 19 includes the subject matter of Example 18, including or omitting optional elements, wherein the set of predetermined criteria comprises at least one of a signal peak of the one or more data signals, an efficiency of the array of power amplifiers, or a back-off power level.

Example 20 includes the subject matter of any of Examples 18-19, including or omitting optional elements, further comprising: generating a tradeoff between a saturation power level and a back-off power level of at least one power amplifier of the array of power amplifiers to increase a transmission efficiency of the one or more data signals via the array of antenna ports coupled to the array of power amplifiers in a millimeter wave frequency band.

Example 21 includes the subject matter of any of Examples 18-20, including or omitting optional elements, wherein the processing the one or more data signals with the array of power amplifiers comprises: phase shifting the one or more data signals differently along signal chains coupled to the array of power amplifiers, respectively.

Example 22 includes the subject matter of any of Examples 18-21, including or omitting optional elements, further comprising: communicating the one or more data signals at a first output power range with a first set of power amplifiers of the array of power amplifiers at a back-off point from a first saturation power level; and communicating the one or more data signals at a second output power range with a second set of power amplifiers of the array of power amplifiers at the back-off point from a second saturation power level.

Example 23 includes the subject matter of any of Examples 18-22, including or omitting optional elements, wherein the second output power range is greater than the second output power range, and the first set of power amplifiers comprises a greater number of power amplifiers than the second set of power amplifiers in the array of power amplifiers.

Example 24 includes the subject matter of any of Examples 18-23, including or omitting optional elements, further comprising: selectively activating power amplifiers of the array of power amplifiers to increase an overall array power efficiency based on a back-off target level and a predetermined ratio of a first number of power amplifiers and a second number of power amplifiers of the array of power amplifiers, wherein the first number of power amplifiers comprise a lower peak power level than the second number of power amplifiers.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A phased array communication system comprising:
   an array of transmission units comprising:
      an unequal array of power amplifiers that is a plurality of power amplifiers comprising a first power amplifier and a second power amplifier having different output powers and different saturation power levels between the first power amplifier and the second power amplifier;
      an array of antenna ports, coupled to the unequal array of power amplifiers, configured to receive a plurality of input signals comprising different phases and gains, respectively;
   wherein the array of transmission units is configured to generate over air a combined signal by transmitting at least two signal outputs at a predetermined angle over the air to reconstruct an amplitude and phase modulated signal of at least one signal of the plurality of input signals; and
   an adaptation component configured to selectively activate the unequal array of power amplifiers to process the at least one signal of the plurality of input signals via the array of antenna ports based on a set of predetermined criteria.

2. The phased array communication system of claim 1, further comprising:
a weighting component configured to weight combinations of power amplifiers of the unequal array of power amplifiers based on a range of power efficiencies of the unequal array.

3. The phased array communication system of claim 1, wherein the unequal array of power amplifiers comprises a first number of first power amplifiers and a second number of second power amplifiers that comprise a higher saturation power level than the first number of first power amplifiers.

4. The phased array communication system of claim 3, wherein the first number of first power amplifiers is greater than the second number of second power amplifiers based on a predetermined ratio.

5. The phased array communication system of claim 1, wherein the set of predetermined criteria comprises at least one of a signal peak of the at least one signal, an efficiency of a combination of at least two power amplifiers of the unequal array of power amplifiers, an output power of a power amplifier of the unequal array of power amplifiers, or a saturation power level of the power amplifier.

6. The phased array communication system of claim 1, wherein the adaptation component is further configured to select a combination of power amplifiers from the unequal array of power amplifiers to increase a transmission power efficiency corresponding to a transmission of the at least one signal and an overall efficiency of the array of transmission units.

7. The phased array communication system of claim 1, wherein the adaptation component is further configured to generate a tradeoff between a peak power efficiency and a back-off power efficiency to increase a total power efficiency of the unequal array of power amplifiers and the array of antenna ports for transmitting signals by increasing an amount of back-off power and decreasing an amount of peak power of the unequal array of power amplifiers.

8. The phased array communication system of claim 1, further comprising:
a plurality of phase shifters coupled to the array of transmission units; and
a clipping component, coupled to the plurality of phase shifters, configured to clip peak levels of the plurality of input signals.

9. A phased array device comprising:
an unequal array of power amplifiers that is a plurality of power amplifiers comprising a first set of power amplifiers and a second set of power amplifiers different from the first set of power amplifiers;
an array of antenna ports, coupled to the unequal array of power amplifiers, configured to transmit data signals having a phase and a gain that are respectively different from among the data signals, over the air at a predetermined angle, and reconstruct, over the air, an amplitude and a phase modulated signal comprising the phase and the gain from at least two of the transmit data signals over the air; and
an adaptation component configured to selectively activate the unequal array of power amplifiers to process the at least one signal of the plurality of input signals via the array of antenna ports based on a set of predetermined criteria.

10. The phased array device of claim 9, wherein the data signals include WiGig signals or 5G signals transmitted or received in a millimeter wave band.

11. The phased array device of claim 9, wherein the first set of power amplifiers is configured to communicate the data signals at a first output power range and operate at a first saturation power level, and the second set of power amplifiers is configured to communicate the data signals at a second output power range and operate at a second saturation power level that are different from the first output power range and the first saturation power level.

12. The phased array device of claim 11, wherein the second set of power amplifiers of the unequal array of power amplifiers comprises a higher saturation power level than the first set of power amplifiers of the unequal array of power amplifiers.

13. The phased array device of claim 9, wherein the set of predetermined criteria comprises a back-off power point comprising about 8 dB or greater from a peak saturation power of the first set of power amplifiers and a power efficiency target comprising approximately at least 50% or power efficiency.

14. The phased array device of claim 9, further comprising:
a plurality of processing chains, coupled to the unequal array of power amplifiers and the array of antenna ports, comprising:
an I/O RF digital-to-analog converter configured to convert the data signals from a radio frequency to a millimeter wave frequency; and
a set of switching units configured to connect at least one first power amplifier of the first set of power amplifiers and at least one second power amplifier of the second set of power amplifiers.

15. The phased array device of claim 9, wherein the first set of power amplifiers and the second set of power amplifiers comprises a ratio of 1 to N in number that is replicated throughout the unequal array of power amplifiers, wherein N is an integer of at least 2.

16. A method for a millimeter wave communication device comprising:
processing data signals with an array of power amplifiers having unequal saturation power levels and unequal transmission powers based on a set of predetermined criteria;
selectively activating power amplifiers of the array of power amplifiers to increase a power efficiency of the array of power amplifiers based on a back-off power and a ratio of a first number of power amplifiers and a second number of power amplifiers of the array of power amplifiers, wherein the first number of power amplifiers comprise a lower peak power level than the second number of power amplifiers; and
transmitting the data signals, via an array of antenna ports coupled to the array of power amplifiers, at a predetermined angle that combines the data signals over air and reconstructs an amplitude and a phase modulated signal from a phase and a gain of at least one of the data signals over the air.

17. The method of claim 16, wherein the set of predetermined criteria comprises at least one of a signal peak of the data signals, an efficiency of the array of power amplifiers, or a back-off power level.

18. The method of claim 16, further comprising:
generating a tradeoff between a saturation power level and a back-off power level of at least one power amplifier of the array of power amplifiers to increase a transmission efficiency of the data signals via the array of antenna ports coupled to the array of power amplifiers in a millimeter wave frequency band by increasing an amount of back-off power of the at least one power amplifier and decreasing an amount of peak power of the at least one power amplifier.

19. The method of claim 16, wherein the processing the data signals with the array of power amplifiers comprises:
phase shifting the data signals differently along signal chains coupled to the array of power amplifiers, respectively.

20. The method of claim 16, further comprising:
communicating the data signals at a first output power range with a first set of power amplifiers of the array of power amplifiers at a back-off power from a first saturation power level of the first set of power amplifiers; and
communicating the data signals at a second output power range with a second set of power amplifiers of the array of power amplifiers at the back-off power point from a second saturation power level of the second set of power amplifiers.

21. The method of claim 20, wherein the second output power range is greater than the second output power range, and the first set of power amplifiers comprises a greater number of power amplifiers than the second set of power amplifiers in the array of power amplifiers.

* * * * *